United States Patent [19]
Morelos-Zaragoza et al.

[11] Patent Number: 6,101,626
[45] Date of Patent: Aug. 8, 2000

[54] METHOD FOR CHOOSING CODING SCHEMES, MAPPINGS, AND PUNCTURING RATES FOR MODULATIONS/ENCODING SYSTEMS

[75] Inventors: Robert Morelos-Zaragoza, San Jose; Advait M. Mogre, Fremont, both of Calif.

[73] Assignee: LSI Logic Corporation, Milpitas, Calif.

[21] Appl. No.: 09/018,678

[22] Filed: Feb. 4, 1998

[51] Int. Cl.$^7$ .................................................. H03M 13/03
[52] U.S. Cl. ........................................................ 714/786
[58] Field of Search .................................. 714/786, 792; 375/265

[56] References Cited

U.S. PATENT DOCUMENTS

| | | | |
|---|---|---|---|
| 5,150,381 | 9/1992 | Forney, Jr. et al. ..................... | 375/261 |
| 5,621,761 | 4/1997 | Heegard ................................... | 375/265 |

OTHER PUBLICATIONS

Pietrobon, et al., Rotationally Invariant Nonlinear Trellis Codes for Two–Dimensional Modulation, IEEE, 1994, pp. 1773–1791.

Berg, L et al., Design Procedure for Optimum or Rotationally Invarinat trellis Codes, IEEE, 1990, pp. 607–613.

Lee–Fang Wei, Rotationally Invariant Trellis–Coded Modulations with Multidimensional M–PSK, IEEE, 1989, pp. 1281–1295.

McEliee, R. et al. The Extended Invariant Factor Algorithm with Application to the Forney Analysis of Convolutional Codes, IEEE, p. 142.

Esmaeili et al., Canonical Representation of Quasi–Cyclic Codes, IEEE, p. 348, 1995.

Rossin et al., Rotationally Invariant, Punctured Trellis Coding, IEEE, p. 126, 1995.

Henkel et al., A Semi–Algebraic Construction to Achieve Rotationally Invariant Coded QAM on the Basis of Multi-levl Convolutional Codes, IEEE, p. 285, 1993.

Kasami et al., ON Linear Structure and Phase Rotation Invariant Properties of Block M–Psk Modulation Codes, IEEE, p. 164–167, 1991.

Kjell Jorgen Hole, Rate k/(k+1) Minimal Punctured Convolutional Encoders, IEEE, p. 653–655, 1991.

Yow–Jong Liu et al., On TCM Schemes Transparent to Constant Phase and Frequency Shifts, IEEE, p. 384–388, 1990.

Mengali et al., Phase Ambiguity Resolution in Trellis–Coded Modulations, IEEE, p. 2087–2088, 1990.

Fettweis, New Rotationally Invariant Trellis Codes for 8PSK Modulation, IEEE, p. 1388–1392, 1989.

*Primary Examiner*—Albert De Cady
*Assistant Examiner*—Shelly A Chase

[57] ABSTRACT

The purpose of the present invention is to provide a method for choosing the coding schemes, mappings, and puncturing rates for a modulation/demodulation system which would allow the system to compensate for certain transformations of the code in a post-Viterbi step as opposed to pre-Viterbi. This would allow for faster and simpler decoding of a code. The method includes the steps of: choosing a coding scheme and puncturing rate; determining a code generator matrix using said coding scheme and puncturing rate; multiplying the code generator matrix by the transformation matrix by the code generator matrix's feedback free right inverse and seeing if the outcome is equal to the code generator matrix multiplied by the transform matrix; multiplying the error matrix by the code generator matrix's feedback free right inverse by the code generator matrix and seeing if the outcome is equal to the error matrix; repeating all the steps until a code generator matrix that satisfies said invariancy equations is found; and choosing a mapping scheme that takes advantage of the invariancy.

6 Claims, 2 Drawing Sheets

PUNCTURED CODE RATE = 3/4

METHOD FOR CHOOSING CODING SCHEMES, MAPPINGS, AND PUNCTURING RATES FOR MODULATIONS/ENCODING SYSTEMS

BACKGROUND OF THE INVENTION

1. Field of the Invention

The present invention relates to modulation and encoding of signals. More specifically, the present invention relates to a method for choosing coding schemes, mappings, and puncturing rates for system which uses modulation and encoding.

2. The Prior Art

Referring first to FIG. 1, a communication system having a digital signal transmission and receiving system is illustrated. A transmission portion of the digital signal transmission and receiving system includes an encoder 10, a puncturing module 12, and a modulator 14 providing a modulated signal at a communication channel 16. Similarly, a receiving portion of the digital signal transmission and receiving system includes a demodulator 18, a depuncturing module 20, and a decoder 22.

The encoder 10 may be a convolutional encoder. Convolutional codes typically include redundant symbols to increase the signal to noise ratio. In this manner, the probability of errors introduced during encoding is minimized. Standard convolutional coding techniques often increase required bandwidth. However, some of the coded bits may be systematically removed in favorable channel conditions through a process called "puncturing".

The puncturing module 12 provides punctured data to the modulator 14. Prior to digital signal transmission, puncturing is typically used to remove redundancy in a codeword. In this manner, symbols are systematically deleted or "punctured". Puncturing may be performed at various rates with respect to the basic unpunctured code. For example, a punctured code rate (or "puncturing rate") of ¾ in a system with a basic rate ½ encoder is achieved where 2 symbols out of every 3 symbol pairs coming out of the encoder are systematically deleted. FIG. 2 depicts this type of puncturing rate. Through the use of puncturing, throughput is substantially increased.

The modulated signal includes an in-phase component and a quadrature component. When the modulated signal is received, after conversion from an analog to a digital signal, each bit is demodulated into the in-phase and quadrature signal components by the demodulator 18 using sine and cosine functions.

Various types of errors may occur in this demodulation step. One of the most common types of errors is a phase rotation, sometimes known as a phase ambiguity or geometric errors. During demodulation, a certain phase is "locked" by a lock detection mechanism. For Quadrature phase shift keyed (QPSK) systems, this lock detection mechanism, however, oftentimes has trouble distinguishing between a phase position of θ and 90° j+0 (where j=2,3, or 3). For example, a lock detection mechanism may accidentally lock in a phase of 90 degrees instead of 0 degrees. Thus, every sequence that comes out of the demodulator would be out of phase by 90 degrees. A similar problem occurs in 8-PSK systems, where lock detection mechanisms have trouble distinguishing between a phase position of θ and 45° j+0 (where j=1 ... 7).

Referring again to FIG. 1, the decoder 26 may comprise a Viterbi decoder, which may be used to decode these convolutional codes. Before the Viterbi decoder handles the sequence, however, it checks to see if the sequence is a valid one. If the sequence is invalid, the Viterbi decoder will not be able to decode the sequence at all. To prevent this from occurring, a pre-Viterbi compensation block 20 can be used along with a synchronization block 24 before the Viterbi decoder is encountered. The pre-Viterbi compensation block 20 basically modifies the sequence, then the synchronization block 24 checks to see if the sequence is synchronized. If not, feedback from the synchronization block 24 to the pre-Viterbi compensation block 20 causes the pre-Viterbi compensation block 20 to modify the sequence again, this time in a different fashion. Eventually, by trying all the possible phases, the correct "synchronized" one will be encountered, at which point the Viterbi decoder 24 can proceed with the decoding process. Because of the multiple iterations required to "synchronize" the input to the Viterbi decoder 24, however, the synchronization step takes a long time.

What is needed is a method which would speed up this synchronization step while still maintaining accuracy.

BRIEF DESCRIPTION OF THE INVENTION

The purpose of the present invention is to provide a method for choosing the coding schemes, mappings, and puncturing rates for a modulation/demodulation system which would allow the system to compensate for certain transformations of the code in a post-Viterbi step as opposed to pre-Viterbi. This would allow for faster and simpler decoding of a code. The method includes the steps of: choosing a coding scheme and puncturing rate; determining a code generator matrix using said coding scheme and puncturing rate; multiplying the code generator matrix by the transformation matrix by the code generator matrix's feedback free right inverse and seeing if the outcome is equal to the code generator matrix multiplied by the transform matrix; multiplying the error matrix by the code generator matrix's feedback free right inverse by the code generator matrix and seeing if the outcome is equal to the error matrix; repeating all the steps until a code generator matrix that satisfies said invariancy equations is found; and choosing a mapping scheme that takes advantage of the invariancy.

DETAILED DESCRIPTION OF THE INVENTION

Figure 1:
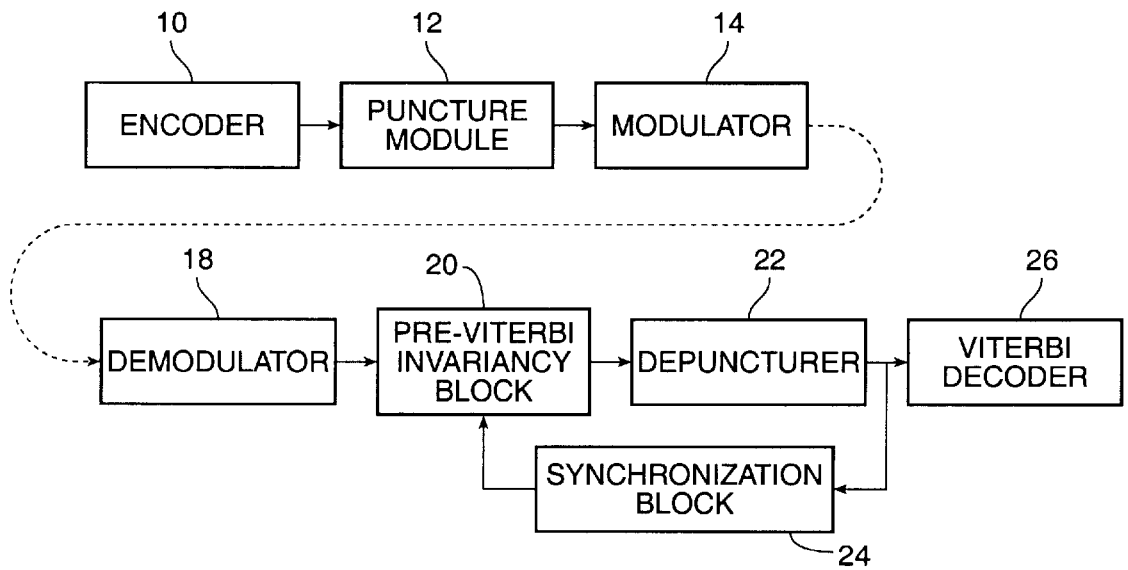
FIG. 1 depicts a communication system having a digital signal transmission and receiving system.

Those of ordinary skill in the art will realize that the following description of the present invention is illustrative only and not in any way limiting. Other embodiments of the invention will readily suggest themselves to such skilled persons.

A code C is defined by a code generator matrix G. G is determined by a number of factors, but two of the factors that are integral in determining G are the puncturing/depuncturing rate of the system and the coding scheme. Determining G using the puncturing/depuncturing rate of the system and the coding scheme is a process known in the relevant art.

For a given input sequence U, let V E C be the resultant codeword generated by G. The codeword V comprises a sequence of symbols {C[i]}, where i is the given symbol index or position. Then V undergoes transformation, such that the received codeword is now V'=T(V, i). If for every V E C, there exists a unique transformed V' E C, then the code is considered to be invariant to the transformation T(V, i).

For a given code C of puncture rate k/n, G is a k×n matrix. Since an input stream of sequence must be operated on piecewise, the operations of the codes can be represented by the formula v=uG. Here, u is assumed to be a section of the input sequence of k consecutive input symbols (i.e. a row vector of dimension 1×k). The generated sequence of n output symbols comprises a row vector v of dimension 1×n.

Similarly, a transformation on a given codeword V is also assumed to be applied in a piecewise manner (i.e. v'=T(v, i), where v' is of dimension 1×n). If invariancy exists, then there exists a u' such that v'=u'G. We can assume that G has a feedback free right inverse given by $G_R^{-1}$, which is an n×k matrix with the property that $GG_R^{-1}=I$, where I is a k×k identity matrix. We can also assume a general class of transformations v'=T(v, i) described by: v'32 vT(i)+e, where e is a constant 1×n row vector and T(i) is an n×n matrix. T(i) can be referred to simply as T, giving v'=vT+e. These are known as affine transformations and substituting v=uG into the equation gives v'=uGT+e=uG'+e (where G'=GT).

We then define $T_u=GTG_R^{-1}$ and $u_e=eG_R^{-1}$. Therefore, in order for phase invariancy to hold, the following two formulas must be satisfied:

$$T_u G = G'$$

and $$u_e G = e$$

These two formulas can be called the invariancy formulas. If these two formulas are satisfied for a given G (which is defined by the puncturing/depuncturing rate of the system and the number of coded bits per symbol), then the system can be called "invariant" to the specific transformation T.

Being invariant to a given transformation, however, does not always aid in the process of decoding. It is only if the system is able to take advantage of this invariancy that the process can be sped up or simplified. As discussed earlier, rotational (or geometric) errors in the code are some of the most common errors encountered. For these type of errors, where the entire code has been shifted by some number of degrees (in an 8-PSK system, a multiple of 45 degrees), it is possible to choose a coding scheme in such a way so as to eliminate the need to compensate for the given rotation before the Viterbi decoder is encountered. This allows the system to perform fewer iterations, and thus run at a faster rate. Since for a given puncturing/depuncturing rate, a given mapping used for the code, and a given number of coded bits per symbol there will be certain transformations which are invariant and certain transformation which are not, the system can be designed so as to take advantage of the fact that it need not correct for certain phase orientations prior to the sequence passing through the Viterbi decoder.

Figure 3:
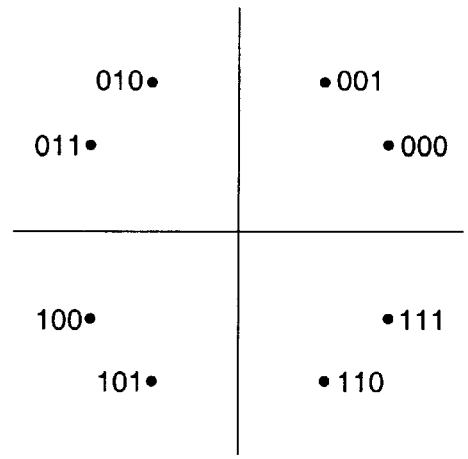
FIG. 3 depicts an Ungerböck mapping.

For example, suppose an 8-PSK system is used, and a puncturing rate and coding scheme are chosen in such a way that the system is invariant to 90 degree rotation errors. If the proper mapping is chosen, the system will not have to correct for 90 degree phase rotations before the Viterbi decoder is encountered. FIG. 3 depicts a common mapping strategy for 8-PSK systems called Ungerböck mapping. This mapping has the additional advantage of working for our purposes as a suitable match for a system which is invariant to 90 degree rotations. If the mapping is such that the two least significant digits in each word are the "coded" bits, and the most significant bit is uncoded, then one can see the advantage. A shift of 90 degrees only has the effect of inverting the second least significant bit in the word. The uncoded bit may have to be corrected for at some point, however since it does not pass through the Viterbi decoder, it can be disregarded for purposes of this application. If the original encoded word was "00", a 90 degree phase rotation error would then simply change it to "10". A 90 degree phase rotation error on an original encoded word of "10" would simply change it to "00". In fact, any 90 degree rotation simply has the effect of inverting the second least significant bit. Thus, 90 degree phase rotations will not have to be corrected for in a pre-Viterbi block.

Figure 2:
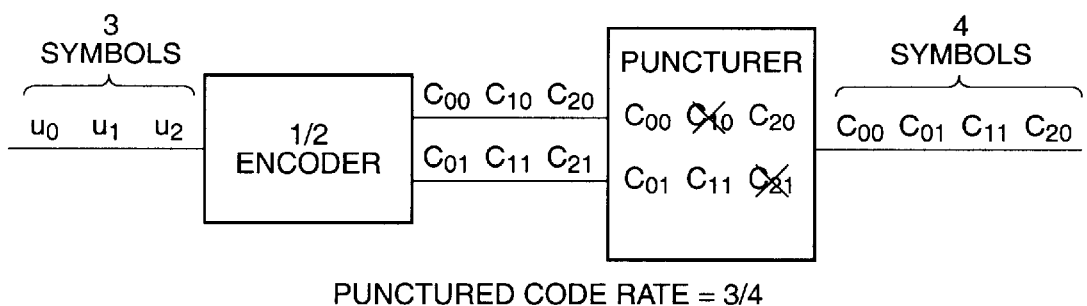
FIG. 2 depicts a system with a ¾ punctured code rate.

For geometric errors, this choice of mapping can be summed up as saying if that particular transformation is performed on one of the words, a proper mapping choice is one where the particular transformation causes either none of the coded bits to change, or for some of the coded bits to change in a way that can be corrected for in a post Viterbi step. For example, referring again to the Ungerböck mapping in FIG. 2, any 90 degree rotation inverts one and only one of the coded bits (if a 2 coded bits per symbol scheme is assumed, thus the two least significant bits are the coded bits). All the possible 90 degree rotations as affecting the coded bits are: 00, 01, 00, 01 or 01, 11, 01, 11.

While correction of these invariant rotations may still have to be corrected in a post-Viterbi block, this procedure is relatively simple since it may monitor the bit error rate at the output of the Viterbi decoder, the synchronization stage in an outer RS decoder, a synchronization byte in MPEG2 transport streams, or some other piece of data which will allow it to determine the transformation that has occurred due to the rotation. This provides substantial time and implementation savings over the "multiple iteration" approach. By judiciously choosing the mapping scheme, coding, and puncturing/depuncturing rate according to the method described, the design of a hardware implementation has been greatly simplified.

Figure 4:
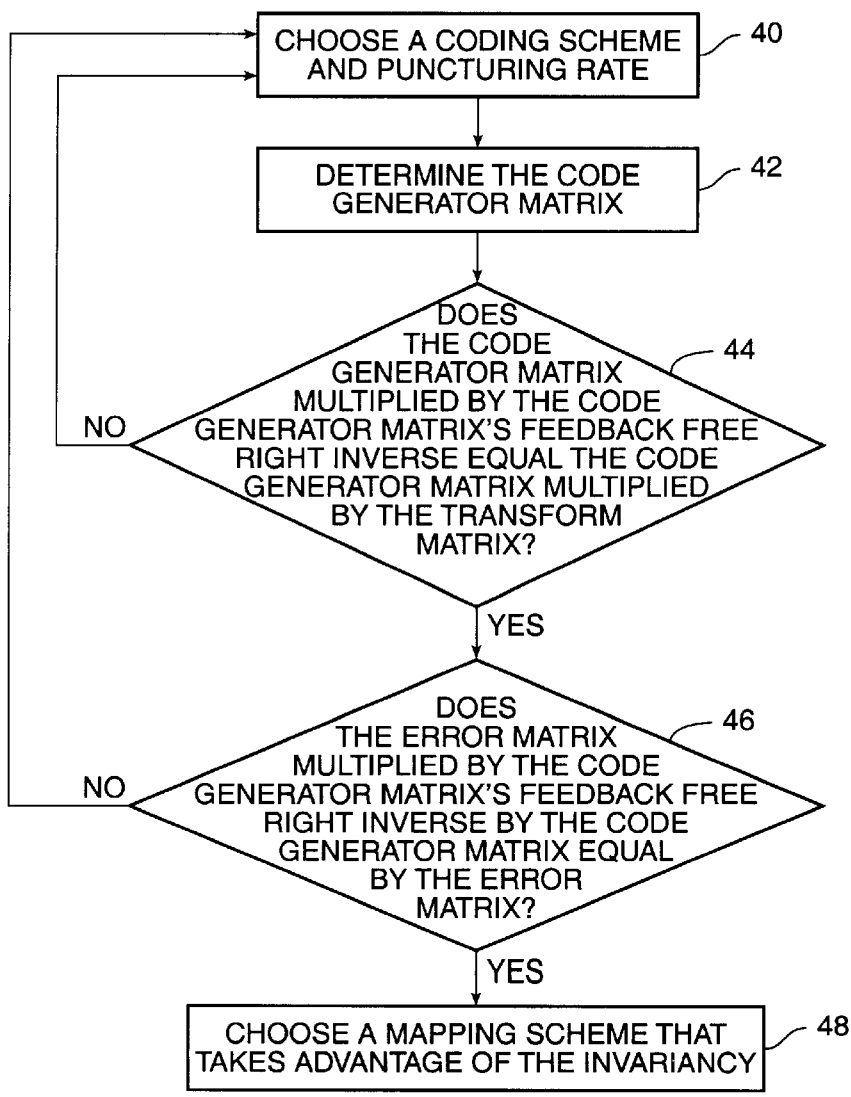
FIG. 4 depicts a flow diagram of the presently preferred embodiment of the invention.

A method in accordance with a presently preferred embodiment of the invention is depicted in the flow diagram in FIG. 4. First, at step 40, a coding scheme and puncturing rate is chosen. Then, at step 42, the code generator matrix is determined using the process known in the prior art (with the coding scheme and puncturing rate affecting the code generator matrix). Then the two invariancy equations are tested. First, at step 44, the code generator matrix is multiplied by the code generator matrix's feedback free right inverse and the result is compared to the result of the code generator matrix multiplied by the transform matrix. If they are not equal, the method returns to step 40 where a new coding scheme/puncturing rate combination is chosen. If they are equal, the second invariancy equation is tested at step 46. Here, the error matrix is multiplied by the code generator matrix's feedback free right inverse, which is then multiplied by the code generator matrix. This result is compared to the error matrix. If they are not equal, the method returns to step 40 where a new coding scheme/puncturing rate combination is chosen. If they are equal, the two invariancy equations have been satisfied and the system is invariant to transformation T. Then, at step 48, a mapping scheme is chosen in such a way as to take advantage of this invariancy to transformation T.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for choosing the coding schemes, mappings and puncturing rates for a modulation/encoding system including the steps of:

finding a code generator matrix such that the system is invariant to a certain transformation by which an invariancy may be created, wherein said finding step includes the steps of:

choosing a coding scheme and a puncturing rate, determining a code generator matrix using said coding scheme and said puncturing rate, checking if said code generator matrix satisfies both of two invariancy equations, wherein said two invariancy equations are $T_u$ G=G' and $u_e$ G=e, wherein $T_u$=G T $G_R^{-1}$, $u_e$=e $G_R^{-1}$, G'=GT, e is a constant, and $G_R^{-1}$ is the right free inverse of G, and repeating said choosing and determining steps until said code generator matrix satisfies said both of two invariancy equations; and choosing a mapping scheme that can advantageously use said invariancy.

2. The method of claim 1 wherein said checking step includes the steps of:

multiplying the code generator matrix by the transformation matrix by the code generator matrix's feedback free right inverse and seeing if the outcome is equal to the code generator matrix multiplied by the transform matrix; and multiplying the error matrix by the code generator matrix's feedback free right inverse by the code generator matrix and seeing if the outcome is equal to the error matrix.

3. A method for choosing the encoded schemes, mappings, and puncturing rates for a modulation/encoding system including the steps of:

finding a code generator matrix such that the system is invariant to a certain geometric transformation, wherein said finding step includes the steps of:

choosing a coding scheme and a puncturing rate, determining a code generator matrix using said coding scheme and said puncturing rate, checking if said code generator matrix satisfies both of two invariancy equations, wherein said two invariancy equations are $T_u$ G=G' and $u_e$ G=e, wherein $T_u$=G T $G_R^{-1}$, $u_e$=e $G_R^{-1}$, G'=GT, e is a constant, and $G_R^{-1}$ is the right free inverse of G, and repeating said choosing and determining steps until said code generator matrix satisfies said both of two invariancy equations; and choosing a mapping scheme such that said geometric transformation results in one of either no change to a plurality of coded bits, or a change in said plurality of coded bits such that said change can be corrected in a post-Viterbi step.

4. The method of claim 3 wherein said checking step includes the steps of:

multiplying the code generator matrix by the transformation matrix by the code generator matrix's feedback free right inverse and seeing if the outcome is equal to the code generator matrix multiplied by the transform matrix; and multiplying the error matrix by the code generator matrix's feedback free right inverse by the code generator matrix and seeing if the outcome is equal to the error matrix.

5. A method for choosing the coding schemes, mapping, and puncturing rates for an 8-PSK system including the steps of:

finding a code generator matrix such that the system is invariant to 90-degree rotations, wherein said finding step includes the steps of:

choosing a coding scheme and a puncturing rate, determining a code generator matrix using said coding scheme and said puncturing rate, checking if said code generator matrix satisfies both of two invariancy equations, wherein said two invariancy equations are $T_u$ G=G' and $u_e$ G=e, wherein $T_u$=G T $G_R^{-1}$, $u_e$=e $G_R^{-1}$, G'=GT, e is a constant, and $G_R^{-1}$ is the right free inverse of G, and repeating said choosing and determining steps until said code generator matrix satisfies said both of two invariancy equations; and choosing a mapping scheme such that a 90-degree rotation inverts one and only one of the coded bits.

6. The method of claim 5 wherein said checking step includes the steps of:

multiplying the code generator matrix by the transformation matrix by the code generator matrix's feedback free right inverse and seeing if the outcome is equal to the code generator matrix multiplied by the transform matrix; and multiplying the error matrix by the code generator matrix's feedback free right inverse by the code generator matrix and seeing if the outcome is equal to the error matrix.

* * * * *